United States Patent
Liu et al.

(10) Patent No.: US 12,331,404 B2
(45) Date of Patent: Jun. 17, 2025

(54) CARBON NANOTUBE COMPOSITE HYDROGEN EVOLUTION CATALYTIC FILM AND METHOD FOR MAKING THE SAME

(71) Applicants: Tsinghua University, Beijing (CN); HON HAI PRECISION INDUSTRY CO., LTD., New Taipei (TW)

(72) Inventors: Kai Liu, Beijing (CN); Chenyu Li, Beijing (CN); Mingda Liu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 197 days.

(21) Appl. No.: 17/945,380

(22) Filed: Sep. 15, 2022

(65) Prior Publication Data
US 2023/0304158 A1 Sep. 28, 2023

(30) Foreign Application Priority Data
Mar. 25, 2022 (CN) .......................... 202210305474.1

(51) Int. Cl.
*C23C 18/12* (2006.01)
(52) U.S. Cl.
CPC ...... *C23C 18/1204* (2013.01); *C23C 18/1245* (2013.01); *C23C 18/1279* (2013.01); *C23C 18/1291* (2013.01)
(58) Field of Classification Search
CPC ............ C23C 18/1204; C23C 18/1245; C23C 18/1279; C23C 18/1291
See application file for complete search history.

(56) References Cited

U.S. PATENT DOCUMENTS 11,584,649 B2 * 2/2023 Liu .......................... B01J 35/23
2023/0357885 A1 * 11/2023 Tour ...................... C22B 11/046

FOREIGN PATENT DOCUMENTS

| CN | 109956527 | 7/2019 |
| CN | 111939942 | 11/2020 |
| CN | 111939942 A | * 11/2020 ............ B01J 23/755 |

OTHER PUBLICATIONS

Lightly Fe-doped (NiS2/MoS2)/Carbon Nanotube Hybrid Electrocatalyst Film with Laser-Drilled Micropores for Stabilized Overall Water Splitting and pH-Universal Hydrogen Evolution Reaction, Chenyu Li, et al., Journal of Materials Chemistry A, Issue 34, pp. 1-10,2020.
"Self-scarificing templated preparation of nitrogen-doped molybdenum carbide/carbon as hydrogen evolution electrocatalyst", Xiaoming Fan, et al., CIESC Journal, vol. 71, Issue 6, 2020.
Guo et al., Controllable synthesis of molybdenum-based electrocatalysts for a hydrogen evolution reaction,Journal of Materials Chemistry A,2017.5,4879.

* cited by examiner

*Primary Examiner* — James M Mellott
(74) *Attorney, Agent, or Firm* — ScienBiziP, P.C.

(57) ABSTRACT

A method of making a carbon nanotube composite hydrogen evolution catalytic film is provided. The method includes: providing a carbon nanotube film, wherein the carbon nanotube film defines a plurality of spaced holes; providing a precursor solution containing a molybdenum source and a carbon source, and placing the precursor solution on the carbon nanotube film and drying to obtain a precursor film; and energizing the precursor film.

11 Claims, 17 Drawing Sheets

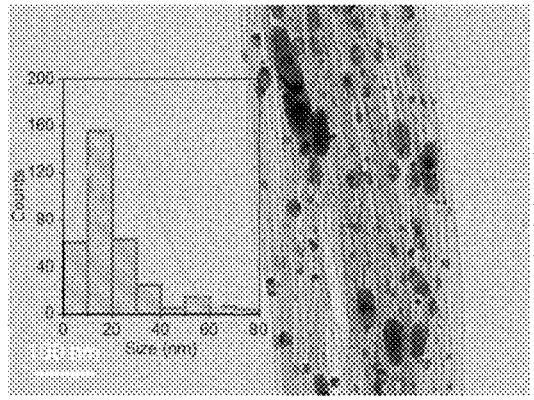 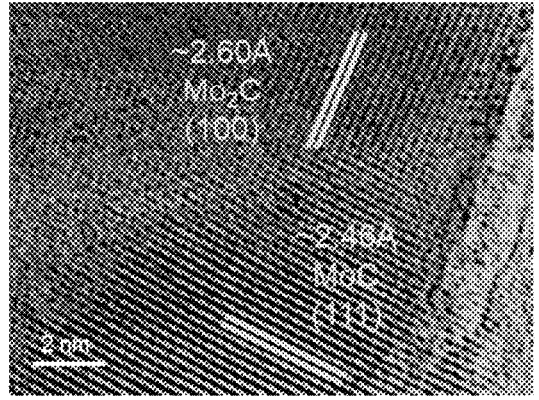
FIG.3A  FIG.3B
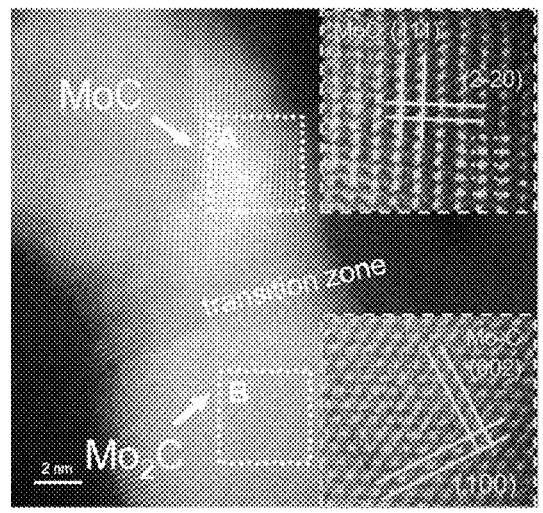
FIG.3C

CARBON NANOTUBE COMPOSITE HYDROGEN EVOLUTION CATALYTIC FILM AND METHOD FOR MAKING THE SAME

CROSS-REFERENCE TO RELATED APPLICATIONS

This application claims all benefits under 35 U.S.C. § 119 from the Chinese Patent Application No. 202210305474.1, filed on Mar. 25, 2022, in the China National Intellectual Property Administration, the disclosure of which is incorporated herein by reference.

FIELD

The present application relates to a carbon nanotube composite hydrogen evolution catalytic film and a method for making the carbon nanotube composite hydrogen evolution catalytic film.

BACKGROUND

Hydrogen evolution reaction (HER) has been considered as a promising approach for hydrogen production. Catalytic activity and stability are important criteria for high-efficiency HER catalysts. In industrial applications, an HER catalyst must be highly active and extremely stable on an electrode at high current densities (e.g., ≥500 or 1000 mA $cm^{-2}$ for ≥300 h) over a long period of time. Pt is usually used for HER but limited for the high cost and scarcity, and thus Pt-group metal-free catalysts with the HER activity comparable to Pt have been extensively studied. Nevertheless, many HER catalysts with high activity usually exhibit low chemical stability, and large mechanical forces suffered by active sites during the release of large quantities of $H_2$ bubbles would continually exfoliate the catalyst from the electrodes, making their mechanical stability difficult to maintain at high current densities. However, approaches to enhancing the stability may weaken the chemical activity of the HER catalysts. For example, additional binders obstruct the exposure of active sites and reduce the overall activity.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will be described, by way of example only, with reference to the attached figures, wherein

FIG. 3A is a transmission electron microscope image of the carbon nanotube composite hydrogen evolution catalytic film.

FIG. 3B is another transmission electron microscope image of the carbon nanotube composite hydrogen evolution catalytic film.

FIG. 3C is yet another transmission electron microscope image of the carbon nanotube composite hydrogen evolution catalytic film.

DETAILED DESCRIPTION

Figure 1:
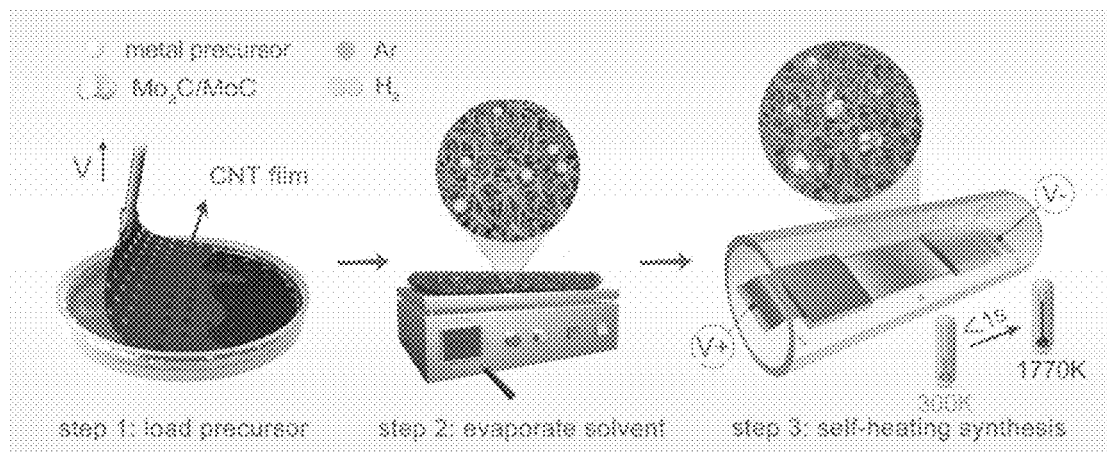
FIG. 1 is a flow diagram of a method for making the carbon nanotube composite hydrogen evolution catalytic film.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape, or other feature that the term modifies, such that the component need not be exact. The term "comprising" means "including, but not necessarily limited to"; it specifically indicates open-ended inclusion or membership in a so-described combination, group, series, and the like. It should be noted that references to "an" or "one" embodiment in this disclosure are not necessarily to the same embodiment, and such references mean "at least one."

Referring to FIG. 1, an embodiment of a method of making a carbon nanotube composite hydrogen evolution catalytic film includes:

S1, providing a carbon nanotube film, wherein the carbon nanotube film defines a plurality of spaced holes;

S2, providing a precursor solution containing molybdate and glucose, and placing the precursor solution on the carbon nanotube film and drying to obtain a precursor film; and S3, energizing the precursor film to form a carbon nanotube composite hydrogen evolution catalytic film.

In step S1, a method of making the carbon nanotube film includes:

S11, providing carbon nanotubes;

S12, adding the carbon nanotubes into a solvent for flocculation treatment to obtain a carbon nanotube flocculent structure; and S13, separating the carbon nanotube flocculent structure from the solvent and drying to obtain the carbon nanotube film.

In step S11, the carbon nanotubes can be a carbon nanotube array, and the carbon nanotube array can be prepared by various methods, such as chemical vapor deposition, graphite electrode constant current arc discharge deposition, or laser evaporation deposition. In one embodiment, the carbon nanotube array is a super-aligned carbon nanotube array (SACNT array) prepared by the chemical vapor deposition. The carbon nanotubes in the SACNT array are substantially parallel to each other and substantially perpendicular to a growth surface of the growth substrate. A blade or other tool is used to scrape the SACNT array from the growth substrate, to obtain the carbon nanotubes.

In step S12, the solvent can be selected from water or volatile organic solvent. The flocculation treatment can be ultrasonic dispersion of the carbon nanotubes or agitating the carbon nanotubes. In one embodiment, the solvent is ethanol, the flocculation treatment is ultrasonic dispersion of the carbon nanotubes. Due to the carbon nanotubes in the solvent having a large specific surface area and the tangled carbon nanotubes having a large van der Waals force, the flocculated and tangled carbon nanotubes can form a network structure (e.g., floccule structure).

In step S13, the carbon nanotube flocculent structure is separated from the solvent by filtering.

The method of defining the plurality of spaced holes in the carbon nanotube film is not limited, as long as the hydrogen can be effectively released through the plurality of holes. In one embodiment, a laser is used for drilling the precursor film, the power of the laser is about 18 W (watts), and the wavelength is about 1064 nanometers. In one embodiment, the power of the laser is 18 W (watts), and the wavelength is 1064 nanometers.

In step S2, the precursor solution is obtained by mixing ammonium molybdate and glucose in an aqueous solution containing an organic solvent. Ammonium molybdate is a molybdenum source, and the glucose is a carbon source. The molybdenum source and carbon source are not limited, and can be selected according to needs. In one embodiment, the organic solvent is ethanol. Furthermore, urea ($CH_4N_2O$) can also be added as the carbon source to adjust the atomic ratio of Mo and C in the precursor solution. Furthermore, in order to promote the dissolution of $(NH_4)_2MoO_4 \cdot 4H_2O$ and prevent the solution from precipitation, ammonia water can also be added into the precursor solution to adjust the pH value of the precursor solution. The precursor solution can be repeatedly dripped onto the carbon nanotube film, and dried continuously during the dripping process. The method of disposing the precursor solution on the carbon nanotube film is not limited. The precursor solution can also be disposed on the carbon nanotube film by infiltration, spraying, etc. The precursor film includes a carbon nanotube film, ammonium molybdate and glucose attached to the carbon nanotube film. In one embodiment, the precursor film consists of a carbon nanotube film, ammonium molybdate, glucose and urea, and the ammonium molybdate, glucose and urea is attached to the carbon nanotube film. In one embodiment, the carbon nanotube film was placed on a heating table at 60 degrees Celsius, and the precursor solution was repeatedly dropped onto the carbon nanotube film several times, and the precursor solution includes ammonium molybdate, glucose, and urea.

In step S3, the step of energizing the precursor film is performed in a protective atmosphere. The method for energizing the precursor film is to connect both ends of the carbon nanotube film to a power supply. The temperature of the carbon nanotube film increases after being energized, so as to realize a self-heating process. In one embodiment, two ends of the carbon nanotube film are clamped with graphite clips, then the carbon nanotube film is put into a quartz tube, and the graphite clips are connected to a stable power supply through copper foil, the self-heating process of the carbon nanotube film is carried out in a mixed atmosphere of 10% hydrogen and 90% argon.

The method for energizing the precursor film further includes:

S31, setting the power of the power supply to 30 watts (W) and the application time to 20 seconds-60 seconds; and S32, then adjusting the power of the power supply to 135 W and the application time to 10 seconds –120 seconds.

In step S31, when the power of the power supply is 30 W and the application time is in a range of 20 s to 60 s, glucose or urea located on the carbon nanotube film can be carbonize and ammonium molybdate can be decomposed. At the same time, it can prevent water molecules generated by the carbonization of glucose and the decomposition of ammonium molybdate from corroding the carbon nanotube film at high temperature.

In step S32, when the power of the power supply is adjusted to 135 W and the application time is in a range of 10 s to 120 s, the glucose/urea and ammonium molybdate react on the carbon nanotube film to form a composite of molybdenum carbide ($Mo_2C$) and molybdenum carbide (MoC), and the composite of $Mo_2C$ and MoC is chemically bonded to the carbon nanotube film. The composite of $Mo_2C$ and MoC is represented by "$Mo_2C$/MoC composite". The $Mo_2C$/MoC composite is connected to the carbon nanotube film through Mo—C bonds.

The precursor film is formed into the carbon nanotube composite hydrogen evolution catalytic film by the self-heating process, and the carbon nanotube composite hydrogen evolution catalytic film comprises the $Mo_2C/MoC$ composite and the carbon nanotube film. Here, the carbon nanotube composite hydrogen evolution catalytic film can be represented by "$Mo_2C/MoC$/carbon nanotube film".

Furthermore, the method of making the carbon nanotube composite hydrogen evolution catalytic film comprises a cleaning step. After forming the $Mo_2C/MoC$/carbon nanotube film, the $Mo_2C/MoC$/carbon nanotube film can be washed with deionized water and ethanol sequentially, and dried. In one embodiment, the $Mo_2C/MoC$/carbon nanotube film was washed three times with deionized water and ethanol sequentially, and dried in air at room temperature.

Figure 2:
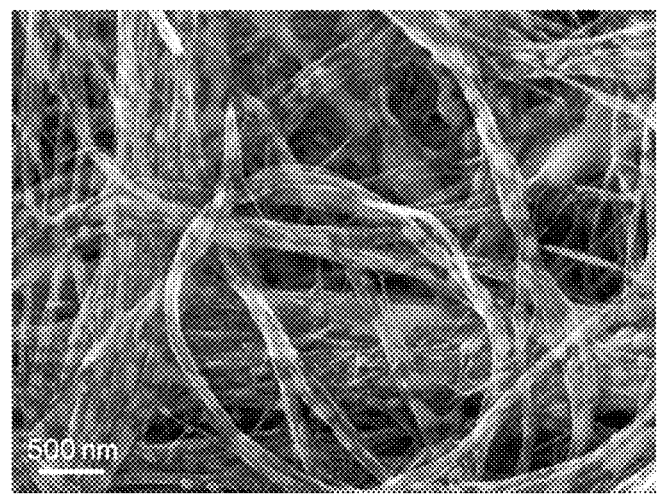
FIG. 2 is a scanning electron microscope image of the carbon nanotube composite hydrogen evolution catalytic film.

Referring to FIG. 2, an embodiment of a carbon nanotube composite hydrogen evolution catalytic film is provided. The carbon nanotube composite hydrogen evolution catalytic film comprises the $Mo_2C/MoC$ composite and the carbon nanotube film. In one embodiment, the carbon nanotube composite hydrogen evolution catalytic film consists of the $Mo_2C/MoC$ composite and the carbon nanotube film. The $Mo_2C/MoC$ composite are heterogeneous nanoparticles, the heterogeneous nanoparticles are located on a surface of the carbon nanotube film and in micropores of the carbon nanotube film.

The carbon nanotube film includes a plurality of long, curved, disordered carbon nanotubes entangled with each other. The carbon nanotube film can be isotropic. The carbon nanotubes can be substantially uniformly dispersed in the carbon nanotube film. Adjacent carbon nanotubes are acted upon by van der Waals attractive force to obtain an entangled structure. Due to the carbon nanotubes in the carbon nanotube film being entangled with each other, the carbon nanotube film has excellent flexibility and can be fashioned into desired shapes with a low risk to the integrity of the carbon nanotube film. Further, the carbon nanotube film is a free-standing film. Thus, the carbon nanotube composite hydrogen evolution catalytic film also has excellent flexibility and is a free-standing film.

The term "free-standing" includes, but is not limited to, the carbon nanotube composite hydrogen evolution catalytic film does not have to be supported by a substrate. For example, the free-standing carbon nanotube composite hydrogen evolution catalytic film can sustain the weight of itself when it is hoisted by a portion thereof without any significant damage to its structural integrity. So, if the free-standing carbon nanotube composite hydrogen evolution catalytic film is placed between two separate supporters, a portion of the free-standing carbon nanotube composite hydrogen evolution catalytic film, not in contact with the two supporters, would be suspended between the two supporters and yet maintain film structural integrity.

The micropores are formed between adjacent carbon nanotubes, so that the carbon nanotube film defines a plurality of micropores. In one embodiment, the $Mo_2C/MoC$ composite are located on the outer surface of the plurality of carbon nanotubes and located in the micropores.

The carbon nanotube composite hydrogen evolution catalytic film defines a plurality of holes spaced apart from each other. The plurality of holes are periodically arranged. The plurality of holes passes through the carbon nanotube composite hydrogen evolution catalytic film from the thickness direction of the carbon nanotube composite hydrogen evolution catalytic film. The diameter of each hole ranges from about 30 microns to about 50 microns. The distance between adjacent through holes ranges from about 100 microns to about 1600 microns. In one embodiment, the diameter of each hole is about 40 microns, and the distance between adjacent holes is about 800 microns. In one embodiment, the diameter of each hole is microns, and the distance between adjacent holes is 800 microns.

The $Mo_2C/MoC$ composite comprises heterogeneous nanoparticles, the diameter of the heterogeneous nanoparticles is in a range of 10 nanometers to 20 nanometers. The heterogeneous nanoparticles are located on the carbon nanotube film, and connected to the carbon nanotube film through Mo—C bonds, and the Mo—C bonds act as solder joints. The heterogeneous nanoparticles can tightly connect the plurality of carbon nanotubes to prevent slippage between the carbon nanotubes. Thus, the heterogeneous nanoparticles can enhance binding force between adjacent carbon nanotubes, thereby enhancing the strength of the carbon nanotube composite hydrogen evolution catalytic film. The $Mo_2C/MoC$ composite is composed of $Mo_2C$ and $MoC$. The molar ratio of Mo and C can be 1:1, 4:3, 2:1 or 4:1. In one embodiment, the molar ratio of Mo and C can be 4:3.

The following are specific embodiments of the present application, which cannot limit the present application.

Preparation of the Carbon Nanotube Film

The carbon nanotubes are derived from a super-aligned carbon nanotube (SACNT) array, which is synthesized in a low-pressure chemical vapor deposition system. In the SACNT array, the carbon nanotubes are much denser and aligned much better than those in ordinary arrays and have a very clean surface and good electrical conductivity with few defects. To prepare the carbon nanotube film, 20 mg carbon nanotubes are removed out of the SACNT array into 250 ml ethanol and dispersed under high-power probe ultrasonication (SCIENTZ-950E) for 5 minutes. Then, the carbon nanotube film is fabricated by suction filtration from the above mixed solution. After the carbon nanotube film is sufficiently dried, small round holes with a diameter of 40 mm are cut from it by a laser cutting machine as the substrate, and the wavelength of the laser is 1064 nanometers. The distance between adjacent round holes is 800 microns.

Synthesis of the Precursor Film $(NH_4)_2MoO_4 \cdot 4H_2O$ and $C_6H_{12}O_6$ are dissolved in mixed solution of deionized water and ethanol at different ratios to obtain the precursor solution, and the Mo:C atomic ratios of the precursor solution are 1:1, 4:3, 2:1 and 4:1, respectively. In order to promote the dissolution of $(NH_4)_2MoO_4 \cdot 4H_2O$ in the mixed solution and prevent the mixed solution from precipitation, ammonia water was added to the mixed solution to adjust the pH value of the mixed solution to about 11.5. The precursor solution is dropped on the carbon nanotube film, and the carbon nanotube film is placed on a heating table at 60 degrees Celsius. Then the precursor solution is continuously added dropwise to the carbon nanotube film for several times until the load is about 5 mg, then the precursor film is obtained after drying the carbon nanotube film with the precursor solution.

Synthesis of the Carbon Nanotube Composite Hydrogen Evolution Catalytic Film

The two ends of the carbon nanotube film in the precursor film are clamped with graphite clips, and then the carbon nanotube film is put into a quartz tube. The graphite clips are connected to a stable power supply through copper foil. The self-heating process of the carbon nanotube film is carried out in a reducing atmosphere of 10% hydrogen and 90% argon. The self-heating process comprises two steps to obtain the carbon nanotube composite hydrogen evolution catalytic film. Step 1, the power of the power supply is adjusted to 30 W, the heating time is 30 s, and the temperature is raised from room temperature to 1100K during the self-heating process. Step 2, the power of the power supply is adjusted to 135 W, the heating time is 10 s-120 s, and the temperature is raised from 1100K to 1770K. Before testing, the carbon nanotube composite hydrogen evolution catalytic film is washed three times with deionized water and ethanol in turn and dried in air at room temperature.

In addition, for the following study, the precursor solution is prepared again according to the ratio of Mo:C atomic ratio of 4:3, and the $(NH_4)_2MoO_4 \cdot 4H_2O$, $C_6H_{12}O_6$ and $CH_4N_2O$ are dissolved in a mixed solution of deionized water and ethanol to prepare the precursor solution. Here, the molar ratios of $C_6H_{12}O_6$ and $CH_4N_2O$ are 0, 10:1, 20:3, 5:3, respectively.

The following electrochemical tests of the carbon nanotube composite hydrogen evolution catalytic film are performed. In the test diagrams, for simplicity and clarity, the carbon nanotube composite hydrogen evolution catalytic film is represented by $Mo_2C/MoC/CNT$ film.

FIG. 2 shows scanning electron microscope images of the $Mo_2C/MoC/CNT$ film. As shown in FIG. 2, the $Mo_2C/MoC$ particles are uniformly dispersed on the surface of carbon nanotubes without agglomeration.

FIGS. 3A to 3C are transmission electron microscope images of the $Mo_2C/MoC/CNT$ film. As shown in FIG. 3A, most $Mo_2C/MoC$ particles have a particle size of 20 nanometers. As shown in FIGS. 3B and 3C, the nanoparticles comprise $Mo_2C$ particles and MoC particles.

Figure 4:
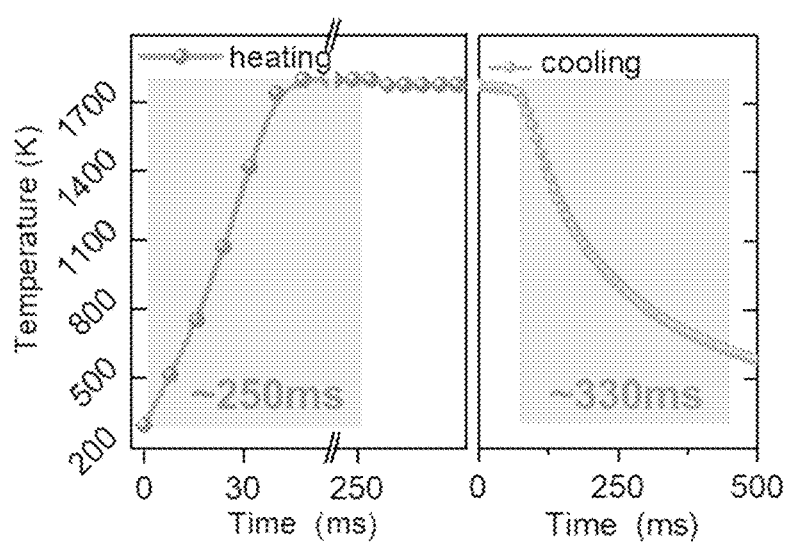
FIG. 4 is a temperature-time curve of heating and cooling of the carbon nanotube film during the self-heating process.

FIG. 4 shows a temperature-time curve of heating and cooling of the carbon nanotube film during the self-heating process. As shown in FIG. 4, it takes only 256 milliseconds to heat the carbon nanotube film from room temperature to about 1770K, and only about 330 milliseconds to cool from about 1770K to 600K, which shows that the self-heating process of the carbon nanotube film can achieve rapid heating and cooling, and the heating and cooling rate exceeds $10^4 K\ s^{-1}$.

Figure 5:
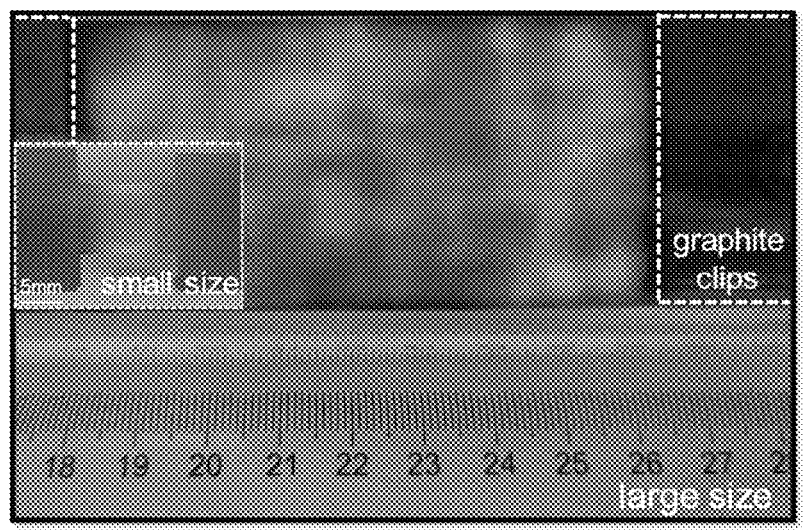
FIG. 5 is an optical image of the carbon nanotube film during the self-heating process.

FIG. 5 is an optical image of the carbon nanotube film during the self-heating process. As shown in FIG. 5, the carbon nanotube film emits visible light and shows a uniform temperature distribution.

Figure 6:
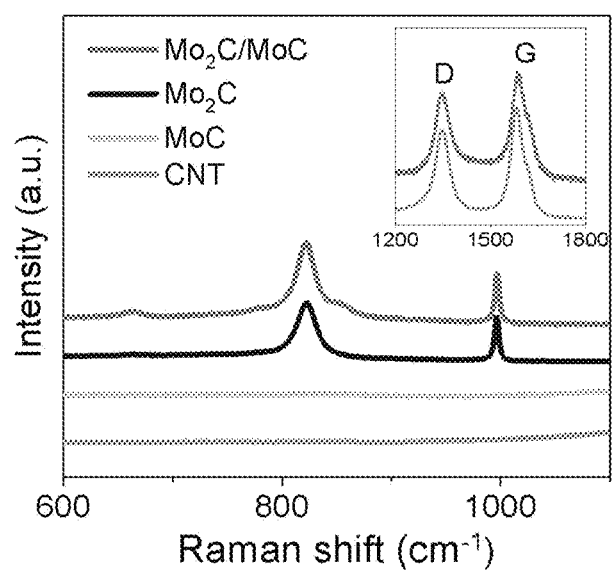
FIG. 6 is a Raman spectrum of a $Mo_2C/MoC/CNT$ film, a $Mo_2C$ powder, a MoC/CNT film, and a CNT film.

FIG. 6 is a Raman spectrum of $Mo_2C/MoC/CNT$ film, $Mo_2C$ powder, MoC/CNT film and CNT film, wherein the inset are the Raman spectrum of D peak and G peak of $Mo_2C/MoC/CNT$ film and CNT film. As shown in FIG. 6, $Mo_2C/MoC/CNT$ film exhibits four distinct Raman peaks, wherein two peaks at 822 $cm^{-1}$ and 995 $cm^{-1}$ belong to β-$Mo_2C$ phase, and the two peaks at 1350 $cm^{-1}$ and 1580 $cm^{-1}$ belong to CNT.

Figure 7:
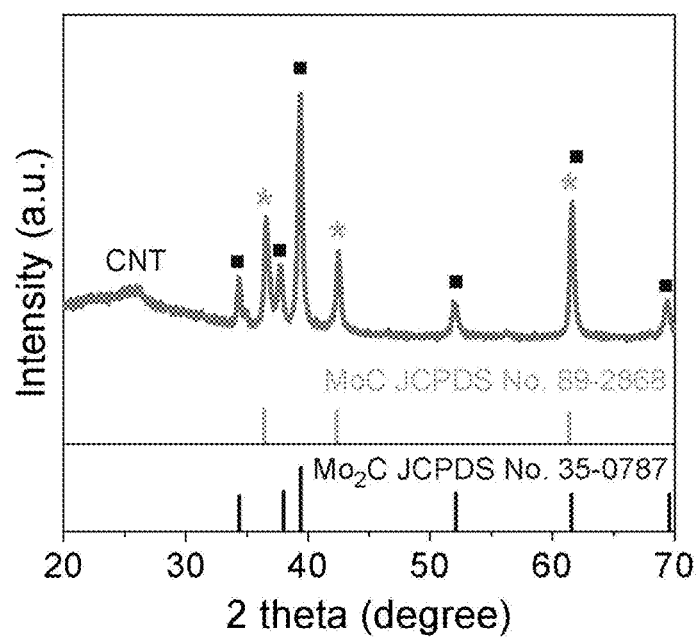
FIG. 7 is an X-ray diffraction (XRD) pattern of the $Mo_2C/MoC/CNT$ film.

FIG. 7 shows an X-ray diffraction pattern of the $Mo_2C/MoC/CNT$ film. As shown in FIG. 7, XRD peaks originate from β-$Mo_2C$, α-MoC and CNT respectively, which indicates that the composition of the $Mo_2C/MoC/CNT$ film is $Mo_2C$, MoC, CNT.

Figure 8:
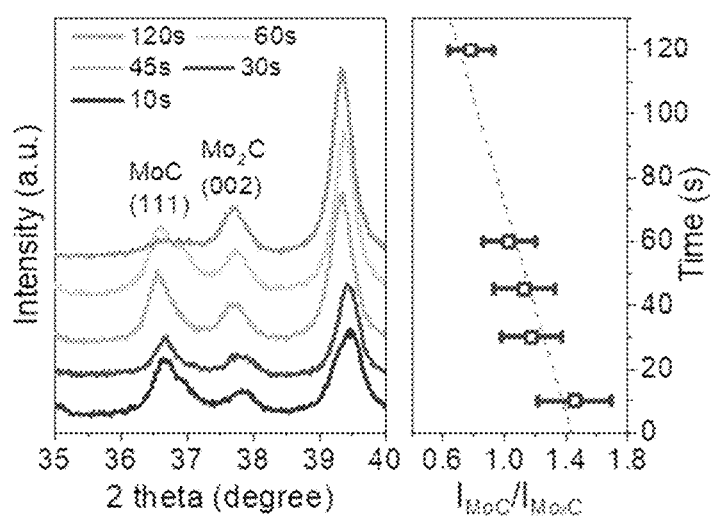
FIG. 8 is an XRD pattern of the $Mo_2C/MoC/CNT$ film under different times when the power of the power supply is 135 W.

FIG. 8 shows an XRD patterns of the $Mo_2C/MoC/CNT$ film under different times when the power of the power supply is 135 W. As shown in FIG. 8, the intensity ratio of the XRD peaks of MoC (111) and $Mo_2C$ (002) decreases with the increase of heating time, which indicates that the content of $Mo_2C$ increase or the content of MoC decrease, which also directly verifies that MoC converts to $Mo_2C$ at high temperature. At the same time, it also indicates that the heating time could regulate the component content of the $Mo_2C/MoC/CNT$ film.

Figure 9:
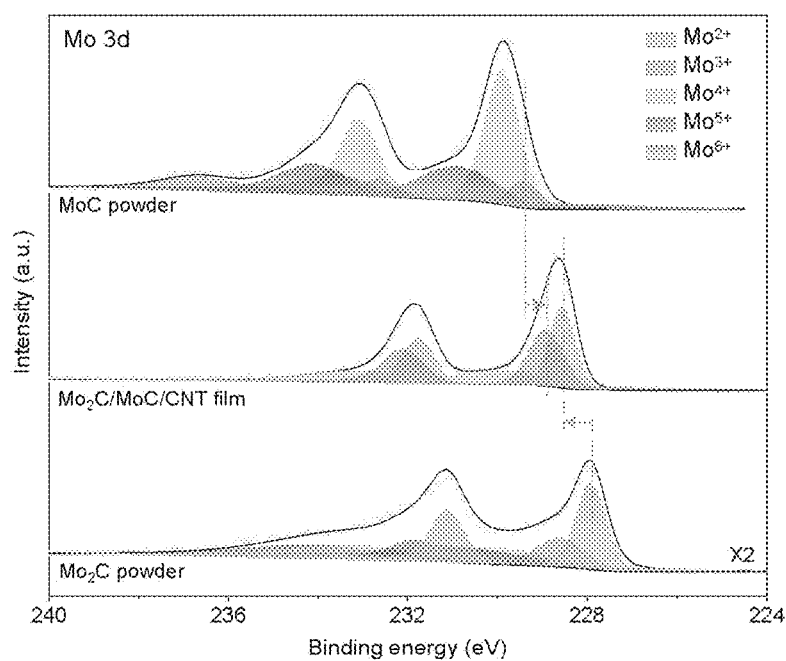
FIG. 9 is an X-ray photoelectron spectrum of a MoC power, the $Mo_2C/MoC/CNT$ film, and Mo 3d in the $Mo_2C$ powder.

FIG. 9 shows an X-ray photoelectron spectrum of MoC power, $Mo_2C/MoC/CNT$ film and Mo 3d in $Mo_2C$ powder. As shown in FIG. 9, the Mo 3d peaks are divided into three groups, wherein the two peaks of Mo 2+ are at 228.5 eV and 231.7 eV, the two peaks of Mo 3+ are at 228.9 eV and 232.1 eV, and the two peaks of Mo4+ are at 229.9 eV and 233.1 eV. Compared with the Mo2+ peaks in $Mo_2C$, the Mo2+ peaks are significantly shifted to the left in the $Mo_2C/MoC/CNT$ film. Compared with the Mo3+ peaks in MoC, the Mo3+ peaks are significantly shifted to the right in the $Mo_2C/MoC/CNT$ film. It indicates that there is electron transfer from $Mo_2C$ to MoC in the heterocomposite structure of $Mo_2C/MoC/CNT$ film.

Figure 10:
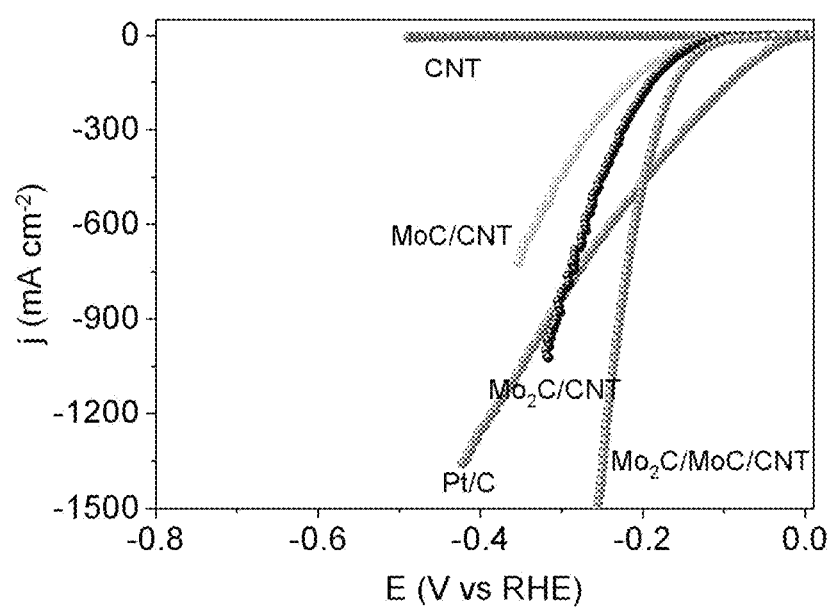
FIG. 10 is a hydrogen evolution polarization curve of the $Mo_2C/MoC/CNT$ film, a $Mo_2C/CNT$ film, the MoC/CNT film, a pure carbon nanotube film and Pt/C in 1MKOH solution.

FIG. 10 shows a hydrogen evolution polarization curve of $Mo_2C/MoC/CNT$ film, $Mo_2C/CNT$ film, MoC/CNT film, pure carbon nanotube film and Pt/C in 1MKOH solution. As shown in FIG. 10, the overpotential of $Mo_2C/MoC/CNT$ film is significantly smaller than that of $Mo_2C/CNT$ film, MoC/CNT film and pure CNT film, thus the transfer of Mo through the interfacial charge is more favorable for the adsorption and desorption of hydrogen. This indicates that the $Mo_2C/MoC/CNT$ film has excellent hydrogen evolution activity, even surpassing the activity of noble metals at high current. In the process of making the $Mo_2C/CNT$ film, when the power of power supply is 30 W, the heating time is 20 minutes. In the process of making the MoC/CNT film, when the power of power supply is 30 W, the heating time is 45 s.

Figure 11:
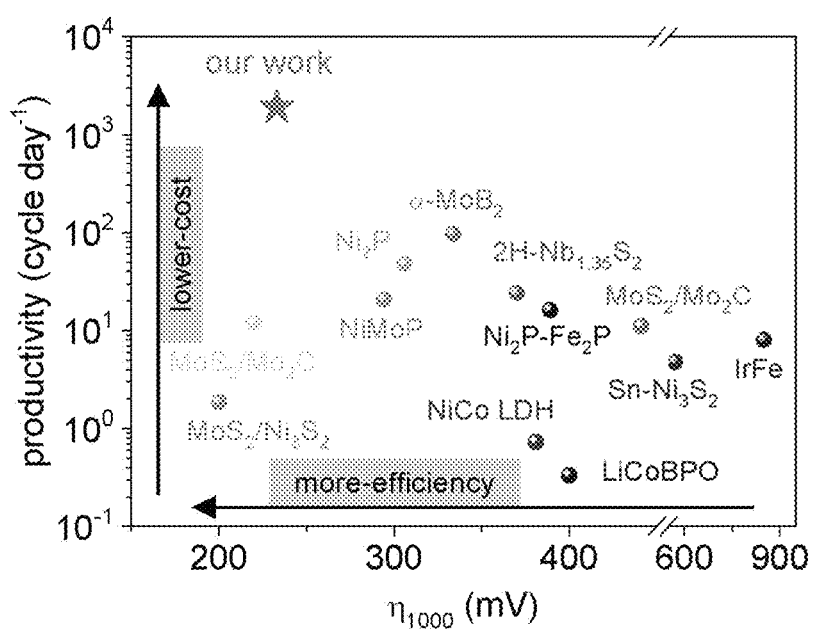
FIG. 11 is a comparison diagram of the production efficiency of the $Mo_2C/MoC/CNT$ film and other catalytic electrodes that maintain the activity of hydrogen evolution catalysts at high current densities.
Figure 12:
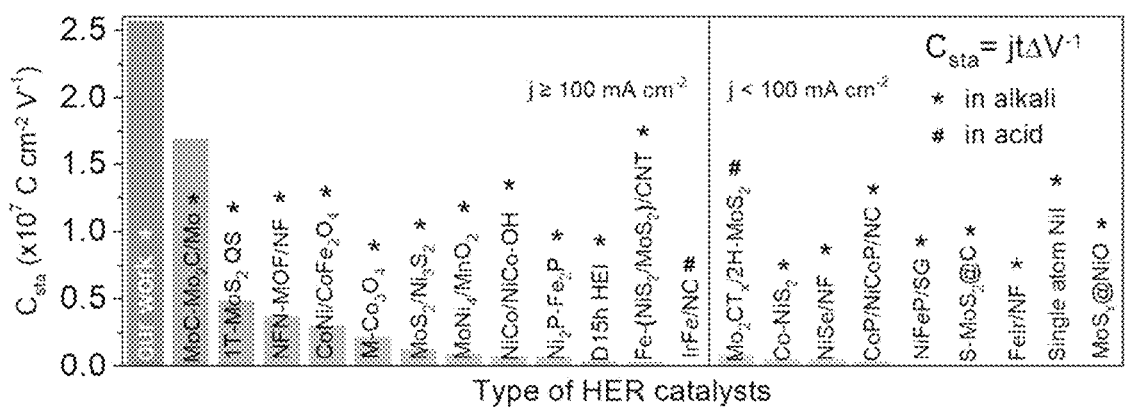
FIG. 12 is a graph comparing the long-term stability of various catalysts at low and high current densities.

FIG. 11 is a comparison diagram of the production efficiency of the $Mo_2C/MoC/CNT$ film and other catalytic electrodes that maintain the activity of hydrogen evolution catalysts at high current densities. FIG. 12 is a graph comparing the long-term stability of various catalysts at low and high current densities. As shown in FIG. 11 and FIG. 12, the $Mo_2C/MoC/CNT$ film has excellent catalytic activity at high current density and high long-term stability, which also shows that the production efficiency of carbon nanotube self-heating process far exceeds the traditional method.

Figure 13:
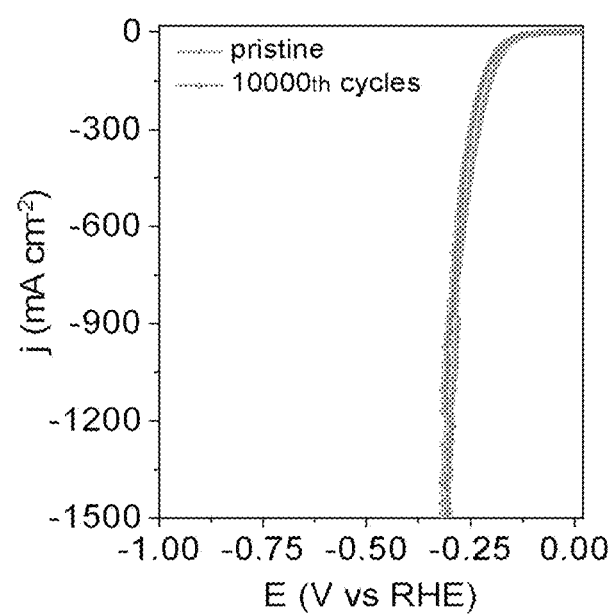
FIG. 13 is an original polarization curve of the $Mo_2C/MoC/CNT$ film and a hydrogen evolution polarization curve after 10000 cycles.

FIG. 13 is an original polarization curve of the $Mo_2C/MoC/CNT$ film and a hydrogen evolution polarization curve after 10000 cycles. As shown in FIG. 13, the $Mo_2C/MoC/CNT$ film has excellent hydrogen evolution cycle stability.

Figure 14:
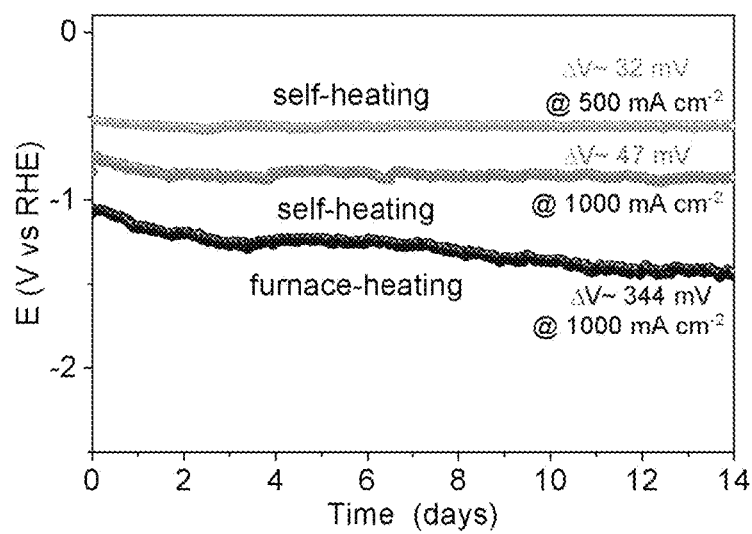
FIG. 14 is a graph of the hydrogen evolution catalytic stability test performed on the $Mo_2C/MoC/CNT$ film made by the self-heating process and a sample heated by a tube furnace under the condition of 500 mA $cm^{-2}$ or 1000 mA $cm^{-2}$.

FIG. 14 is a graph of the hydrogen evolution catalytic stability test performed on the $Mo_2C/MoC/CNT$ film made by the self-heating process and a sample heated by a tube furnace under the condition of 500 or 1000 mA $cm^{-2}$. As shown in FIG. 14, the $Mo_2C/MoC/CNT$ film prepared by self-heating shows little performance degradation after 14 days of operation at current densities of 500 or 1000 mA $cm^{-2}$. However, the performance degradation of the sample prepared by the tube furnace is very obvious after 14 days of operation at current densities of 500 or 1000 mA $cm^{-2}$. This indicates that the samples prepared by the self-process process have higher hydrogen evolution catalytic stability than the samples prepared by the tube furnace.

Figure 15:
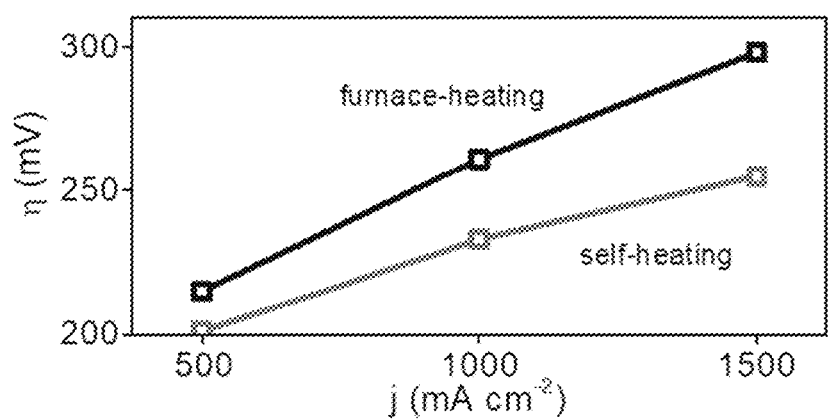
FIG. 15 is a comparison diagram of the hydrogen evolution activity of the $Mo_2C/MoC/CNT$ film prepared by the self-heating method and the $Mo_2C/MoC/CNT$ film prepared by the tube furnace.
Figure 16:
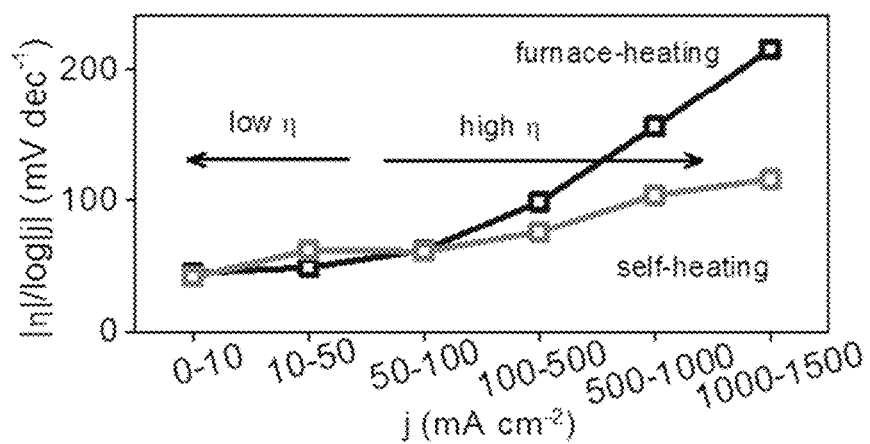
FIG. 16 is a comparison diagram of the Tafel slopes of the $Mo_2C/MoC/CNT$ film prepared by the self-heating process and the $Mo_2C/MoC/CNT$ film prepared by the tube furnace.

FIG. 15 is a comparison diagram of the hydrogen evolution activity of the $Mo_2C/MoC/CNT$ film prepared by the self-heating method and the $Mo_2C/MoC/CNT$ film prepared by the tube furnace. FIG. 16 is a comparison diagram of the Tafel slopes of the $Mo_2C/MoC/CNT$ film prepared by the self-heating process and the $Mo_2C/MoC/CNT$ film prepared by the tube furnace. As shown in FIGS. 15 and 16, the $Mo_2C/MoC/CNT$ film prepared by the self-heating process has higher hydrogen evolution activity than the $Mo_2C/MoC/CNT$ film prepared by the tube furnace.

Figure 17:
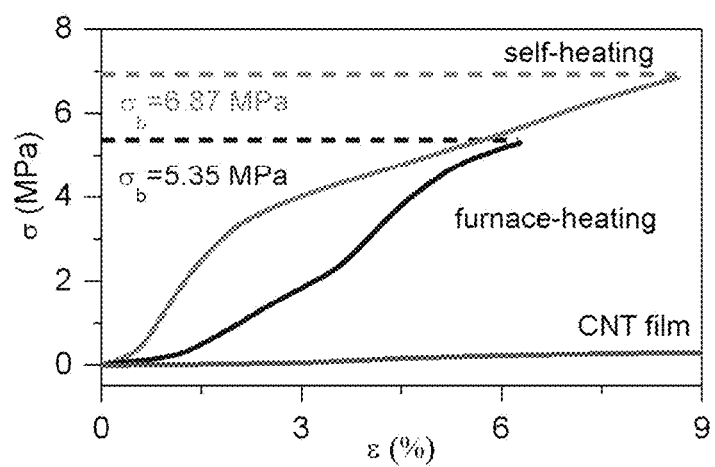
FIG. 17 is a comparison diagram of the mechanical strengths of the $Mo_2C/MoC/CNT$ film prepared by the self-heating process and the $Mo_2C/MoC/CNT$ film prepared by the tube furnace.

FIG. 17 is a comparison diagram of the mechanical strength of the $Mo_2C/MoC/CNT$ film prepared by the self-heating process and the $Mo_2C/MoC/CNT$ film prepared by the tube furnace. As shown in FIG. 17, the $Mo_2C/MoC/CNT$ film prepared by the self-heating process has better mechanical properties than the $Mo_2C/MoC/CNT$ film prepared by the tube furnace. Thus the Mo$_2$C/MoC/CNT film prepared by the self-heating process exhibits better hydrogen evolution stability.

The advantages of the carbon nanotube composite hydrogen evolution catalytic film and making method may include, but are not limited to, the following. Firstly, the making method adopts the carbon nanotube film as a self-heating source, the precursors containing Mo and C can change the temperature within hundreds of milliseconds for in-situ synthesis of the Mo$_2$C/MoC/CNT film. Secondly, the self-heating process of the carbon nanotubes can achieve rapid temperature rise and fall, and the rapid temperature rise and fall process can control the carbonization reaction of the carbon source in time, which is a key factor in the preparation of Mo$_2$C/MoC composite structures. Thirdly, the high temperature shortens the chemical reaction time, so that one reaction cycle only takes tens of seconds and the synthesis efficiency is high. Fourthly, in the Mo$_2$C/MoC/CNT film, the Mo intermediate valence state formed by the electron transfer between the two phases Mo$_2$C and MoC is the main active site for the hydrogen evolution reaction, which makes the Mo$_2$C/MoC/CNT film can still maintain efficient hydrogen adsorption capacity at a large scale of 1500 mA cm$^{-2}$, thus the Mo$_2$C/MoC/CNT film has high catalytic activity. Fifthly, in the Mo$_2$C/MoC/CNT film, the Mo$_2$C/MoC and the carbon nanotube film are bonded by chemical bonds, which not only strengthen the bonding force between the Mo$_2$C/MoC and the carbon nanotube film, but also strengthen the mechanical properties of the carbon nanotube film. The strong interface between the Mo$_2$C/MoC and the carbon nanotube film can enables the Mo$_2$C/MoC/CNT film to work stably at high current densities. At the same time, the chemical bonds between Mo$_2$C/MoC and CNT film can significantly weaken the dissolution and shedding of Mo$_2$C/MoC nanoparticles during the hydrogen evolution reaction, thus the Mo$_2$C/MoC/CNT film has good stability.

Since the interface charge can act as an additional gate electrode in the Schottky barrier region near the drain electrode, when the bipolar carbon nanotube channel is switched between p-type and n-type through a gate voltage, holes or electrons can only be injected into the channel through the narrow Schottky barrier region at the drain electrode, which makes the thin film transistor formed by the interface charge layer have a reconfigurable rectification behavior. At the same time, the gate modulation makes the forward rectification and the reverse rectification switch mutually.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A method of making a carbon nanotube composite hydrogen evolution catalytic film, comprises:
   providing a carbon nanotube film, wherein the carbon nanotube film defines a plurality of holes spaced apart from each other;
   providing a precursor solution containing a molybdenum source and a carbon source, and placing the precursor solution on the carbon nanotube film and drying to obtain a precursor film, wherein the precursor solution contains molybdate, glucose and organic solvent; and
   energizing the precursor film.

2. The method of claim 1, a method of making the carbon nanotube film comprises:
   providing carbon nanotubes;
   adding the carbon nanotubes into a solvent for flocculation treatment to obtain a carbon nanotube flocculent structure; and
   separating the carbon nanotube flocculent structure from the solvent and drying to obtain the carbon nanotube film.

3. The method of claim 2, wherein the flocculation treatment is dispersing the carbon nanotubes by ultrasonic or agitating.

4. The method of claim 1, wherein placing the precursor solution on the carbon nanotube film comprises dripping the precursor solution on the carbon nanotube film.

5. The method of claim 1, wherein the method of energizing the precursor film is performed in a protective atmosphere.

6. The method of claim 1, wherein the method of energizing the precursor film comprises connecting both ends of the carbon nanotube film to a power supply.

7. The method of claim 1, wherein the temperature of the carbon nanotube film increases after being energized.

8. The method of claim 1, wherein the method for energizing the precursor film comprises:
   setting a power of the power supply to 30 W and an application time to 20 seconds-60 seconds;
   adjusting the power of the power supply to 135 W and the application time to 10 seconds –120 seconds.

9. The method of claim 8, wherein when the power of the power supply is 30 W and the application time is in a range of 20 s to 60 s, the carbon source located on the carbon nanotube film is carbonize and the molybdenum source is decomposed.

10. The method of claim 8, wherein when the power of the power supply is adjusted to 135 W and the application time is in a range of 10 s to 120 s, the carbon source and the molybdenum source react on the carbon nanotube film to form a composite of MO$_2$C and MoC.

11. A method of making a carbon nanotube composite hydrogen evolution catalytic film, comprises:
   providing a carbon nanotube film, wherein the carbon nanotube film defines a plurality of holes spaced apart from each other;
   providing a precursor solution containing a molybdenum source and a carbon source, and placing the precursor solution on the carbon nanotube film and drying to obtain a precursor film; and
   energizing the precursor film, wherein the method for energizing the precursor film comprises:
   setting a power of the power supply to 30 W and an application time to 20 seconds-60 seconds;
   adjusting the power of the power supply to 135 W and the application time to 10 seconds –120 seconds.

* * * * *